United States Patent
Downey

(10) Patent No.: US 9,235,554 B2
(45) Date of Patent: Jan. 12, 2016

(54) METHOD AND SYSTEM OF IMPROVED GALOIS MULTIPLICATION

(71) Applicant: Walter J. Downey, Los Gatos, CA (US)

(72) Inventor: Walter J. Downey, Los Gatos, CA (US)

(73) Assignee: Echelon Corporation, San Jose, CA (US)

( * ) Notice: Subject to any disclaimer, the term of this patent is extended or adjusted under 35 U.S.C. 154(b) by 363 days.

(21) Appl. No.: 13/842,542

(22) Filed: Mar. 15, 2013

(65) Prior Publication Data

US 2014/0280408 A1   Sep. 18, 2014

(51) Int. Cl.
*G06F 7/00* (2006.01)
*G06F 17/10* (2006.01)
*G06F 7/72* (2006.01)

(52) U.S. Cl.
CPC ............... *G06F 17/10* (2013.01); *G06F 7/724* (2013.01)

(58) Field of Classification Search
USPC ........................................................ 708/517
See application file for complete search history.

(56) References Cited

U.S. PATENT DOCUMENTS 4,896,029 A * 1/1990 Chandler et al. ............... 235/494
6,263,470 B1 * 7/2001 Hung et al. ..................... 714/784

* cited by examiner

*Primary Examiner* — Tan V. Mai
(74) *Attorney, Agent, or Firm* — Nicholson De Vos Webster & Elliot LLP

(57) ABSTRACT

Embodiments of the invention include an apparatus for performing Galois multiplication using an enhanced Galois table. Galois multiplication may include converting a first and second multiplicand to exponential forms using a Galois table, adding the exponential forms of the first and second multiplicands, and converting the added exponential forms of the first and second multiplicands to a decimal equivalent binary form using the Galois table to decimal equivalent binary result of the Galois multiplication.

10 Claims, 3 Drawing Sheets

Example 1 – multiplication result stays in bottom section

| | | |
|---|---|---|
| 1000 X 1011 = | | -> binary form of 8 and 11 |
| 8 X 11 = | | -> decimal equivalent of binary form to be used as offsets |
| to_exp(8) + to_exp(11) | | -> look up index 8 and index 11 in to_exp table |
| 3 + 7 | = 10 | -> add the exponential forms using standard addition |
| to_bin(10) = 7 | | -> lookup 10 in to_bin table to get back to decimal equiv bin form |
| = 0111 | | -> result in binary form |

Example 2 – multiplication result in middle section

| | | |
|---|---|---|
| 0111 X 1110 = | | -> binary form of 7 and 14 |
| 7 X 14 = | | -> decimal equivalent of binary form to be used as offsets |
| to_exp(7) + to_exp(14) | | -> look up index 8 and index 11 in to_exp table |
| 10 + 11 | = 21 | -> add the exponential forms using standard addition |
| to_bin(21) = 12 | | -> lookup 21 in to_bin table to get back to decimal equiv bin form |
| = 1100 | | -> result in binary form |

Example 3 – multiplication by binary 0 ( 'zero' element)

| | | |
|---|---|---|
| 0111 X 0000 = | | -> binary form of 7 and 0 |
| 7 X 0 = | | -> decimal equivalent of binary form to be used as offsets |
| to_exp(7) + to_exp(0) | | -> look up index 7 and index 0 in to_exp table |
| 10 + 30 | = 41 | -> add the exponential forms using standard addition |
| to_bin(41) = 0 | | -> lookup 41 in to_bin table to get back to decimal equiv bin form |
| = 0000 | | -> result in binary form |

Figure 3

METHOD AND SYSTEM OF IMPROVED GALOIS MULTIPLICATION

FIELD

The embodiments of the invention are related to the field of Galois arithmetic, especially in the field of Galois arithmetic.

BACKGROUND

Modern communication systems often deploy multilayer forward error correction schemes to increase their performance. A typical scheme is to layer a convolutional code on top of a block code. However, the implementation of these coding schemes can be very computationally expensive and introduce substantial delays for encoding and decoding. The delays will reduce the effective data rate attainable on a channel and thus need to be minimized. One method to accelerate the computation is to add specialized hardware at the expense of adding substantial cost to the system. Since these communication systems typically already have at least one general-purpose processor that is required to implement and control the modem, it would be advantageous to use this existing processor to also perform the error correction. A common choice for the block code is a non-binary BCH code called the Reed-Solomon code. This code requires special mathematical operations using Galois math (additions and multiplications) operating on a binary extension field. These special multiply operations are not built into standard processors (even if standard multiplication is built in), and to implement these multiplies can require too many processor cycles to be feasible given the desire to minimize coding delays in the system.

BRIEF DESCRIPTION OF THE DRAWINGS

The present invention is illustrated by way of example, and not by way of limitation, in the figures of the accompanying drawings in which like references indicate similar elements. It should be noted that different references to "an" or "one" embodiment in this disclosure are not necessarily to the same embodiment, and such references mean at least one. Further, when a particular feature, structure, or characteristic is described in connection with an embodiment, it is submitted that it is within the knowledge of one skilled in the art to affect such feature, structure, or characteristic in connection with other embodiments whether or not explicitly described.

FIG. 3 illustrates an exemplary calculation using an enhanced Galois table.

DETAILED DESCRIPTION

Figure 1:
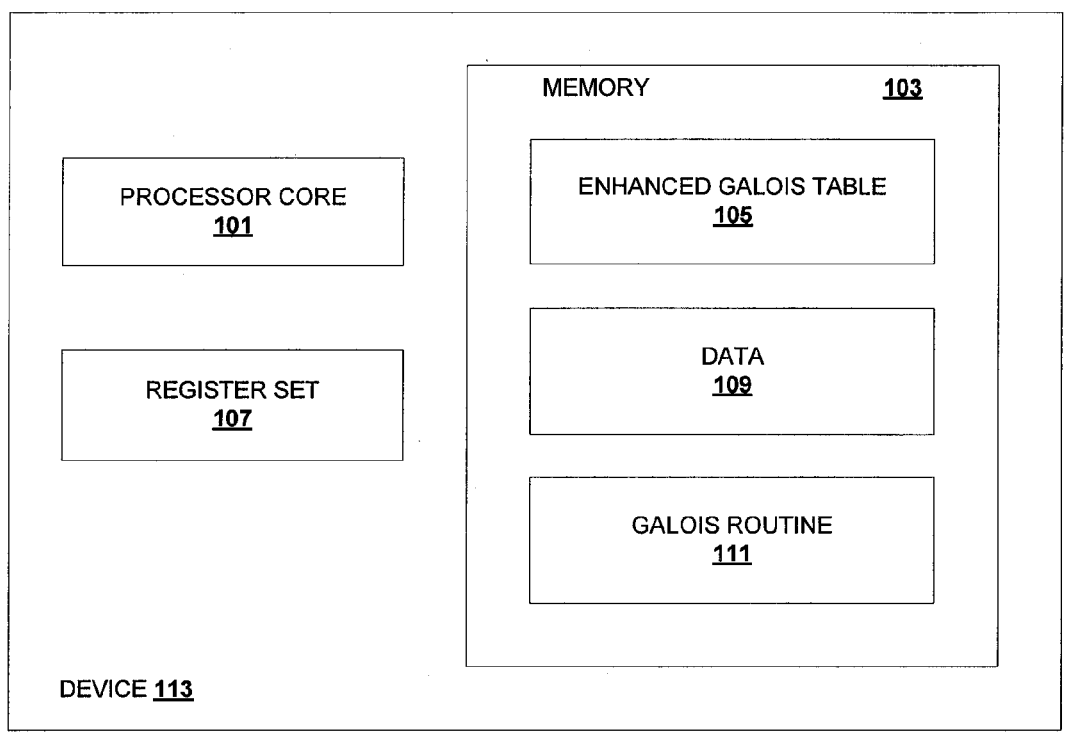
FIG. 1 illustrates an embodiment of a system/device for performing Galois multiplication using an enhanced Galois table.

In the following description, numerous specific details are set forth. However, it is understood that embodiments of the invention may be practiced without these specific details. In other instances, well-known circuits, structures and techniques have not been shown in detail in order not to obscure the understanding of this description. It will be appreciated by one skilled in the art that the invention may be practiced without such specific details. Those of ordinary skill in the art, with the included descriptions, will be able to implement appropriate functionality without undue experimentation.

References in the specification to "one embodiment," "an embodiment," "an example embodiment," etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to implement such feature, structure, or characteristic in connection with other embodiments whether or not explicitly described. In the following description and claims, the terms "coupled" and "connected," along with their derivatives, may be used. It should be understood that these terms are not intended as synonyms for each other. "Coupled" is used to indicate that two or more elements, which may or may not be in direct physical or electrical contact with each other, co-operate or interact with each other. "Connected" is used to indicate the establishment of communication between two or more elements that are coupled with each other.

Many modern embedded processors used in modems rely on performing multiple operations simultaneously by using an instruction pipeline. For normal linear code without conditionals this results in a high instruction throughput. However, when a conditional is encountered in a code path that is required in an algorithm then most embedded pipelined processors become very inefficient. This is because a conditional can cause a data dependent, unpredictable branch which in turn necessitates a disruption in the pipeline. The conditional requires not only several instruction cycles for a comparison and a branch, but also many more cycles for the pipeline to be flushed and then re-filled with instructions.

Galois math operates on a finite set of elements closed under the operations of addition and multiplication. The set of elements spans all representable combinations of values for a given binary width. Unfortunately, to span this complete set of elements a binary extension field must be constructed using a primitive polynomial. This has the effect of severely complicating the multiplication operation that must be used in order to satisfy the necessary requirements for operating on a field since it uses polynomial multiplication and reduction instead of the built-in standard multiplication. The standard way to implement Galois multiplication is through the use of a table. The Galois addition operation, on the other hand, is simply an exclusive OR which is supported in hardware by standard processors. The multiplication technique to be described is applicable to binary extension fields of all bit widths, but for the purposes of brevity a width of only 4 bits will be used defining a Galois field known as GF16 which is based on the primitive polynomial $b^4+b+1$. The table below shows in columns 2-4 the complete set of elements in binary, polynomial and exponential forms thus defining the convention that will be used for the binary representation of the polynomial based elements. Columns 5 and 6 define two functions that are used to convert between the binary and the exponential forms. Multiplication is most easily done using the exponential form and addition is most easily done using the binary form. Implementation of Reed-Solomon encoders and decoders entails repeated addition and multiplication operations, thus requiring constant conversions back and forth. The table (Table 1 below is an example) is constructed such that the Galois element to be converted is used in its current form as the index into the table to convert to the other form.

TABLE 1

| index | exponential | polynomial | binary | to_binary | to_exp |
|---|---|---|---|---|---|
| 0 | $a^0$ | 1 | 0001 | 1 | 15 |
| 1 | $a^1$ | b | 0010 | 2 | 0 |
| 2 | $a^2$ | $b^2$ | 0100 | 4 | 1 |
| 3 | $a^3$ | $b^3$ | 1000 | 8 | 4 |
| 4 | $a^4$ | b + 1 | 0011 | 3 | 2 |
| 5 | $a^5$ | $b^2 + b$ | 0110 | 6 | 8 |
| 6 | $a^6$ | $b^3 + b^2$ | 1100 | 12 | 5 |
| 7 | $a^7$ | $b^3 + b + 1$ | 1011 | 11 | 10 |
| 8 | $a^8$ | $b^2 + 1$ | 0101 | 5 | 3 |
| 9 | $a^9$ | $b^3 + b$ | 1010 | 10 | 14 |
| 10 | $a^{10}$ | $b^2 + b + 1$ | 0111 | 7 | 9 |
| 11 | $a^{11}$ | $b^3 + b^2 + b$ | 1110 | 14 | 7 |
| 12 | $a^{12}$ | $b^3 + b^2 + b + 1$ | 1111 | 15 | 6 |
| 13 | $a^{13}$ | $b^3 + b^2 + 1$ | 1101 | 13 | 13 |
| 14 | $a^{14}$ | $b^3 + 1$ | 1001 | 9 | 11 |
| 15 | $a^{-inf}$ | 0 | 0000 | 0 | 12 |

Although the table 1 is shown as consisting of 6 columns for explanatory purposes, usage of the table only requires 2 columns (columns 5 and 6). In fact normal usage splits the table into 2 sub-tables, one for column 5 and one for column 6.

The bit ordering of the binary form of column 4 is arbitrary so long as it is consistent throughout the table. In table 1 it was chosen that the least significant (rightmost) bit equals the coefficient of the polynomial with power $b^0$ and the next bit equals the coefficient to the polynomial with power $b^1$, then the next bit with power $b^2$, and finally the 4th bit from the right equals the coefficient to the polynomial with power $b^3$. A common different ordering reverses the bit order of the binary form such that the leftmost bit equals the coefficient of the polynomial with power $b^0$, then second bit from the left for the coefficient of the polynomial power $b^1$, the third bit for $b^2$ and the rightmost bit for $b^3$. This does not affect the proper working of the algorithm since all that matters is that the binary form ordering has a consistent mapping for which binary bit represents which polynomial order. Thus table 2 is shown with a different ordering of the binary form. Other orderings will also work. The exponential form (column 2) must match the polynomial form (column 3) and is not arbitrary, although the entire table could be flipped vertically and made to work.

TABLE 2

| index | exponential | polynomial | binary | to_binary | to_exp |
|---|---|---|---|---|---|
| 0 | $a^0$ | 1 | 1000 | 8 | 15 |
| 1 | $a^1$ | b | 0100 | 4 | 3 |
| 2 | $a^2$ | $b^2$ | 0010 | 2 | 2 |
| 3 | $a^3$ | $b^3$ | 0001 | 1 | 6 |
| 4 | $a^4$ | b + 1 | 1100 | 12 | 1 |
| 5 | $a^5$ | $b^2 + b$ | 0110 | 6 | 9 |
| 6 | $a^6$ | $b^3 + b^2$ | 0011 | 3 | 5 |
| 7 | $a^7$ | $b^3 + b + 1$ | 1101 | 11 | 10 |
| 8 | $a^8$ | $b^2 + 1$ | 1010 | 12 | 0 |
| 9 | $a^9$ | $b^3 + b$ | 0101 | 5 | 14 |
| 10 | $a^{10}$ | $b^2 + b + 1$ | 1110 | 14 | 8 |
| 11 | $a^{11}$ | $b^3 + b^2 + b$ | 0111 | 7 | 13 |
| 12 | $a^{12}$ | $b^3 + b^2 + b + 1$ | 1111 | 15 | 6 |
| 13 | $a^{13}$ | $b^3 + b^2 + 1$ | 1011 | 11 | 7 |
| 14 | $a^{14}$ | $b^3 + 1$ | 1001 | 9 | 10 |
| 15 | $a^{-inf}$ | 0 | 0000 | 0 | 12 |

An exemplary method for building the table is now described. The method of assigning which polynomial corresponds to which exponential is derived by first choosing a primitive polynomial (in this case it is $b^4+b+1$). Then a first polynomial is chosen that is always 1 that corresponds to exponential form $a^0$ and placed at index 0. The second polynomial is chosen that is b representing exponential form $a^1$. The remaining next polynomials are all derived by repeatedly multiplying the previous polynomial by the $a^1$ (polynomial b) using standard polynomial multiplication except with modulo-2 addition of like powers of the polynomial. If the polynomial resulting from that multiplication contains a polynomial power greater than n−1, where n is the width of the binary form in the extension field, then the polynomial is reduced by taking the remainder after dividing by the primitive polynomial. Thus, the third polynomial is the second polynomial b times b to get $b^2$. Then the third polynomial $b^2$ is multiplied by b to get $b^3$ which is the fourth polynomial. Continuing the pattern, the fourth polynomial $b^3$ is multiplied by b to get $b^4$. This polynomial has a polynomial power greater than n−1 (n−1=4−1=3), so it must be reduced by using polynomial division. The remainder when performing this polynomial division is b+1 which is the fifth polynomial corresponding to exponential form $a^4$. This process is continued until exponential form 14 is derived for GF16, or in general until the exponent is $2^n-2$ is derived for GF$2^n$. 14 is the stopping point because further multiplication and reduction past exponential form 14 would result in wrapping to the beginning of the table to index 0 and then further multiplication will duplicate the table entries already calculated. The only remaining unused polynomial is 0 and this is put at index 15 at the end of the table with the exponential form given exponent −inf which is chosen for readability only.

In this way the first 3 columns of the table are built where polynomials are put in increasing exponential order with the index into the table (column 1) set to be equal to the exponent of the exponential form column (column 2). The binary form (column 4) for each row is assigned according to the convention chosen and described above for mapping polynomial powers in polynomials from column 3 to bit locations. The to_binary values (column 5) are the decimal equivalent of the binary number in column 4. The to_exp values (column 6) are obtained by reverse look-up using columns 5 and 1. Each value is assigned by using the to_binary value as the index and looking up the corresponding index value in that row to be used as the to_exp value. So the first row to_binary value 8 corresponds to the index value which is 0. Thus at index 8 a 0 is entered to the to_exp column. This is likewise done for all the rows. In this way the entire table is filled out except index 15 of column 5. This can be any value (and is arbitrarily set to 0) since is not used in computation to be described. This is because column 5 is used only after taking a modulo-15 which has valid values of 0 through 14 and not index 15.

Although these examples construct a GF16 binary extension field and the associated tables for a binary width of 4 bits, the same process can be used to construct binary extension fields and tables on any width of bits, the most common being 8 bits that uses a primitive polynomial (sometimes called minimum polynomial or field generator polynomial) of $b^8+b^4+b^3+b^2+1$. Although there are multiple suitable primitive polynomials for each binary width, only certain polynomials will yield a proper Galois extension field. Instead of the table consisting of 16 rows as in the two examples thus explained for GF16, the table for the width 8 binary extension field GF256 would consist of 256 rows. The method to be described to speed up Galois multiplications will work for any valid binary extension field of any width generated using any valid primitive polynomial for that width so long as the proper table is built.

For all elements except binary form 0, multiplication for two Galois elements in binary form is z=to_binary[mod 15(to_exp[x]+to_exp[y])], where the result z is also in binary form. The binary forms are converted to exponential forms via the lookup table column 6, which are then added using standard addition. The resulting sum is taken modulo 15, and then converted back to binary form using column 5 in the table. Note that modulo 15 operation cannot be computed with a single processor operation since it is not an even power of 2 (which then could done with a single logical AND). The modulo could be implemented with a modulo 16 (using a simple AND with the constant 15) and then checked with a conditional and if the non-modulo sum is greater than 15, then one is added. Unfortunately, this extra conditional is costly, especially for pipelined processors. Another solution is to use a second lookup table used after the addition to compute the modulo 15. This table is of length 2 times 15. Although this gets rid of the conditional, it costs another lookup for every multiplication. The other problem (besides the modulo) with this multiplication method is that if either multiplicand X or Y is 0, the formula does not work. So more conditionals must be used to check for this and implement special code for the 0 cases. Again, the conditionals are problematic if fast computation is required. A better method is desired to speed up the Galois multiplication that does not involve conditionals or secondary lookups.

An enhanced tabular method for multiplying Galois elements is described below using an enhanced table as shown below (table 3). This single table eliminates all conditionals, thus taking care of both the modulo problem and the special cases where a multiplicand is zero. The Galois multiplication is then computed using z=to_binary[to_exp[x]+to_exp[y]]. The first part of the table is shown with four columns (index, alpha (exponential), binary conversion, and exponential conversion) used for both conversions to binary and to exponential forms. The second part of the table shown with three columns (index, alpha (exponential), and binary conversion) eliminates the modulo 15 operations and conversions back to binary after the exponents forms are added. The third part of the table, also with three columns (index, alpha (exponential), and binary conversion), takes care of the cases where either the X or Y multiplicands equal zero, and converts back to binary form for those results that would end up with a 0 result. If the case of both X and Y equaling zero must be handled, then the table can be extended by appending 16 zeros to the end of the table. This one extra case adds m more locations to the table for GF($2^m$). But note that in some embodiments some of these locations (e.g., 45-59) will never be used. A more efficient way is to just add one more table index in memory at 60 and then locations 45-59 are free to be used for other purposes. Most linkers have the ability to allocate memory in such a way thus saving m−1 memory locations. For all three parts of the table, the second column is for readability only and is not used in the enhanced multiplication method. Thus, an enhanced Galois table includes the following: 1) a first indexable section wherein each indexable row of the table includes a polynomial representation, and a binary and an exponential function used to convert between a binary and exponential form of the polynomial; 2) a second indexable section wherein each indexable row of the table includes a polynomial representation and a binary function used to convert to a binary form of the polynomial; and 3) a third indexable section wherein each indexable row of the table includes a polynomial representation and a binary function used to convert to a binary form of the polynomial, wherein all of the binary functions are 0. The second section index's binary functions of the second index are identical to those in the first section. This second section must start at the next index (15 in this example) following the last index of the first part of the table (14 in this example). In this example, the second section is thus eliminating the need for a modulo operation. Index 0 (in the first section) is a special case in that its exponential function points to an index in the table where the binary function is 0. The third part of the table starts at the index listed in the fourth column of the first row (index 0); in this example the index value is 30. However, it should be understood that this is merely an exemplary table and the values of the columns and the indexes they reside at, etc. may be different depending upon the implementation.

Note that using a similar method a reverse table could be constructed where the polynomials are put in decreasing exponential order by building the table with successive divides and polynomial reductions. Using this table would require a slightly different method, different only in using a subtraction in place of the addition. This table would be flipped vertically from the table shown with the index 0 exponential function pointing to the highest index of the block of zeros in the third section.

The first part of the table 3 has $2^n-1$ indexes starting at 0 and ending at $2^n-2$, where n is the width of the binary field. It is built from index 0 to index n−2 using the same method used to construct previous table described above i.e. repeated multiplications by $a^1$ and then reduction by the primitive polynomial. There are 15 indexes, 0-14, for the GF16 examples. For a binary field GF256 the first part of the table will have 255 indexes, 0-254. Although 4 columns are shown, only columns 3 and 4 are used. Column 1 is not actually stored but represents the offset address of the data from the start of the table for each column. This first part of the table is normally split into two single column sub-tables since memory is normally arranged as a single linear sequence of addresses.

The second part of the table only uses column 3. It is a repeat of the $2^n-1$ values in the first part of the table. It must be put at offsets immediately following the first part of the table. This automatically takes care of the wrapping that takes place in Galois math when multiplications exceed index 14 or exponent form $a^{14}$. Note that although column 3 is repeated starting at index 15, column 4 of index 15 is left with its original value (12 in this case).

TABLE 3

| index | alpha | to_binary | to_exp |
|---|---|---|---|
| 0 | $a^0$ | 1 | 30 |
| 1 | $a^1$ | 2 | 0 |
| 2 | $a^2$ | 4 | 1 |
| 3 | $a^3$ | 8 | 4 |
| 4 | $a^4$ | 3 | 2 |
| 5 | $a^5$ | 6 | 8 |
| 6 | $a^6$ | 12 | 5 |
| 7 | $a^7$ | 11 | 10 |
| 8 | $a^8$ | 5 | 3 |
| 9 | $a^9$ | 10 | 14 |
| 10 | $a^{10}$ | 7 | 9 |
| 11 | $a^{11}$ | 14 | 7 |
| 12 | $a^{12}$ | 15 | 6 |
| 13 | $a^{13}$ | 13 | 13 |
| 14 | $a^{14}$ | 9 | 11 |
| 15 | $a^0$ | 1 | 12 |
| 16 | $a^1$ | 2 | |
| 17 | $a^2$ | 4 | |
| 18 | $a^3$ | 8 | |
| 19 | $a^4$ | 3 | |
| 20 | $a^5$ | 6 | |
| 21 | $a^6$ | 12 | |
| 22 | $a^7$ | 11 | |
| 23 | $a^8$ | 5 | |
| 24 | $a^9$ | 10 | |
| 25 | $a^{10}$ | 7 | |
| 26 | $a^{11}$ | 14 | |
| 27 | $a^{12}$ | 15 | |

TABLE 3-continued

| index | alpha | to_binary | to_exp |
|---|---|---|---|
| 28 | $a^{13}$ | 13 | |
| 29 | $a^{14}$ | 9 | |
| 30 | $a^{30+}$ | 0 | |
| 31 | $a^{30+}$ | 0 | |
| 32 | $a^{30+}$ | 0 | |
| 33 | $a^{30+}$ | 0 | |
| 34 | $a^{30+}$ | 0 | |
| 35 | $a^{30+}$ | 0 | |
| 36 | $a^{30+}$ | 0 | |
| 37 | $a^{30+}$ | 0 | |
| 38 | $a^{30+}$ | 0 | |
| 39 | $a^{30+}$ | 0 | |
| 40 | $a^{30+}$ | 0 | |
| 41 | $a^{30+}$ | 0 | |
| 42 | $a^{30+}$ | 0 | |
| 43 | $a^{30+}$ | 0 | |
| 44 | $a^{30+}$ | 0 | |
| 60 | $a^{30+}$ | 0 | |

The third part of the table can have any offset from the start of the first part of the table so long as that offset value is placed as the index 0 column 4 value in the first part of the table and the offset does not cause it to overlap with either of the first two parts of the table. The third part of the table contains all zeros in column 3, which is the only column needed. In the example this was placed at the very next available location (location offset 30), but it will work at many other offsets. The third part of the table has two subparts. A first subpart contains $2^n-1$ zeros. This handles the case where only one of the multiplicands is a zero. The second subpart must contain a zero at twice the offset value placed as the index 0 column 4 value in the first part of the table. This handles the case where both multiplicands are zero.

An enhanced Galois table can be built for any binary extension field of any width and built with any valid primitive polynomial. For the common GF256 field of bit width 8 the first part of the table will have indexes from 0 to 254. The second part of the table will have indexes from 255 to 509. The third part of the table will contain 255 consecutive zeros starting at some offset indicated by that table's index 0 column 4 value. It will have a final 0 value at an offset of 510 locations from the start of the third part of the table (which is twice the offset to the beginning of the third part of the table).

FIG. 1 illustrates an embodiment of a system/device for performing Galois multiplication using an enhanced Galois table. This system/device 113 may be any type of computing device, however, it is typically one with one or more lower power or performance processor cores 101 that are not capable of natively doing Galois multiplication. As noted above, many modems rely on Galois multiplication and are one type of device that would utilize embodiments of this invention. The system/device 113 includes a register set associated with the processor core(s).

The system/device also includes memory 103. Typically, this memory is dynamic (such as DRAM), however, in some embodiments the memory is static (for example, SRAM or FLASH). The memory 103 stores the enhanced Galois table 105, data 109 (such as the data array of Figure FFF), and code to run a Galois multiplication routine 111. Not illustrated is code to perform RS decoding or other routines that utilize Galois multiplication.

Figure 2:
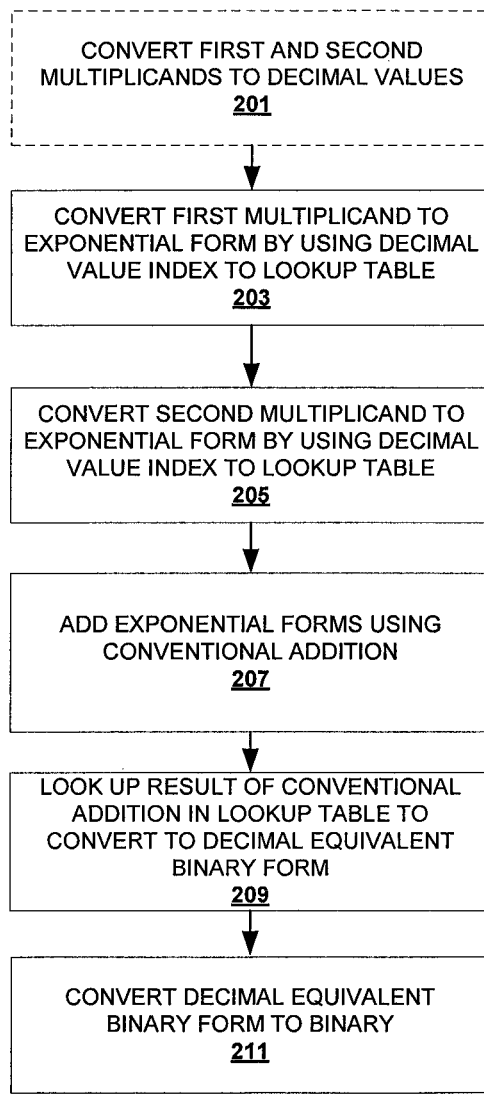
FIG. 2 illustrates an embodiment of a method for Galois multiplication using an enhanced Galois table.

FIG. 2 illustrates an embodiment of a method for Galois multiplication using an enhanced Galois table such as the one shown in Table 3. Additionally, the description of this method will refer to an exemplary calculation that is shown in FIG. 3. At 201, multiplicands to be used in the multiplication are converted to decimal values. Typically, when data is stored in a computing system it is stored in a non-decimal form such as hexadecimal or binary. However, in systems where the data is stored in decimal form this step is not necessary. In the examples of FIG. 3, two multiplicands are to be multiplied. In the first example, 1000b is to be multiplied by 1010b. These values would be converted to be 8 and 11 in decimal form respectively.

The first multiplicand is converted to exponential form by using its decimal value as an index into the lookup enhanced Galois table at 203. Assuming that 8 is the first multiplicand, using 8 as an index into the table points to a decimal equivalent of 3 using the table.

The second multiplicand is converted to exponential form by using its decimal value as an index into the lookup enhanced Galois table at 205. Assuming that 11 is the second multiplicand, using 11 as an index into the table points to a decimal equivalent of 7 using the table. Of course, these two steps may be combined into a single step and more multiplicands may be utilized.

The exponential forms are added using conventional addition at 207. In the example of FIG. 3, 3+7=10.

After the exponential forms are added, the result of that addition is used as an index into the Galois table to get the result in a decimal equivalent binary form. In the example of FIG. 3, when 10 is used as an index the "to_binary" value is 7.

In some embodiments, the decimal equivalent binary form is then converted to binary at 211. In the example that has been discussed this would result in a value of 0111b. In other embodiments, further or other conversions may be made. For example, the result may be converted to hexadecimal.

FIG. 3 also illustrates two other examples of multiplication using the enhanced Galois table. The second example has result that is in the "middle" section of the table that does not include a "to_exp" field. The third example there is a multiplication by 0 which uses the zero elements of the table.

Additionally, the above description is processor and instruction set agnostic. In other words, the above method is not tailored to a particular brand or even type of processor. As such, particular instructions to be used are not described.

Different embodiments of the invention may be implemented using different combinations of software, firmware, and/or hardware. Thus, the techniques shown in the figures can be implemented using code and data stored and executed on one or more electronic devices (e.g., an end system, a network element). Such electronic devices store and communicate (internally and/or with other electronic devices over a network) code and data using computer-readable media, such as non-transitory computer-readable storage media (e.g., magnetic disks; optical disks; random access memory; read only memory; flash memory devices; phase-change memory) and transitory computer-readable transmission media (e.g., electrical, optical, acoustical or other form of propagated signals—such as carrier waves, infrared signals, digital signals). In addition, such electronic devices typically include a set of one or more processors coupled to one or more other components, such as one or more storage devices (non-transitory machine-readable storage media), user input/output devices (e.g., a keyboard, a touchscreen, and/or a display), and network connections. The coupling of the set of processors and other components is typically through one or more busses and bridges (also termed as bus controllers). Thus, the storage device of a given electronic device typically stores code and/or data for execution on the set of one or more processors of that electronic device.

While the flow diagrams in the figures herein above show a particular order of operations performed by certain embodiments of the invention, it should be understood that such order is exemplary (e.g., alternative embodiments may perform the operations in a different order, combine certain operations, overlap certain operations, etc.).

While the invention has been described in terms of several embodiments, those skilled in the art will recognize that the invention is not limited to the embodiments described, can be practiced with modification and alteration within the spirit and scope of the appended claims. The description is thus to be regarded as illustrative instead of limiting.

What is claimed is:

1. An apparatus comprising:
    a processor; and
    a memory to store a Galois multiplication routine which when executed by the processor causes the processor to perform actions comprising:
        converting a first and second multiplicand to exponential forms using a Galois table;
        adding the exponential forms of the first and second multiplicands;
        converting the added exponential forms of the first and second multiplicands to a decimal equivalent binary form using the Galois table to decimal equivalent binary result of the Galois multiplication.

2. The apparatus of claim 1, wherein the routine further comprises: converting the decimal equivalent binary form into binary.

3. The apparatus of claim 1, wherein the Galois table is Table 2.

4. The apparatus of claim 1, wherein the Galois table comprises:
    a first part with columns for an index, exponential, binary conversion, and exponential conversion;
    a second part with columns for an index, exponential, and binary conversion; and a third part with columns for an index, exponential, and binary conversion, wherein each binary conversion has a value of 0.

5. The apparatus of claim 1, wherein the Galois table comprises:
    a first part with all the Galois field elements except zero listed in order of exponents, with a first column of binary numbers for each field element wherein there is a consistent mapping of polynomial coefficients of the field element polynomial's powers to bit positions, and a second column of reverse look-up values wherein the offset for the value is taken from first column and the value is the offset from which the value is taken; and
    a second part with a first column that is a repeat of the first column of the first part and at an offset directly after the end of the first part.

6. The apparatus of claim 5 further comprising:
    a third part of the table with zeros of length equal to two times the number of Galois elements minus 2 wherein the offset of the start of the table is listed as the value in the first row of the second column of the first part of the table.

7. The apparatus of claim 5 further comprising:
    a third part of the table with zeros of length equal the number of Galois elements minus 1 wherein the offset of the start of the table is listed as the value in the first row of the second column of the first part of the table and containing a last zero which is at offset 2 times the value in the first row of the second column of the first part of the table.

8. The apparatus of claim 5 wherein the Galois field is GF256.

9. The apparatus of claim 1, wherein the routine is a part of a Reed-Solomon decoding routine.

10. The apparatus of claim 1, wherein the apparatus is a modem.

* * * * *